(12) United States Patent
Amthor et al.

(10) Patent No.: US 11,802,929 B2
(45) Date of Patent: Oct. 31, 2023

(54) MAGNETIC RESONANCE IMAGING SYSTEM WITH ACOUSTIC WARNING SIGNAL

(71) Applicant: KONINKLIJKE PHILIPS N.V., Eindhoven (NL)

(72) Inventors: Thomas Erik Amthor, Hamburg (DE); Annerieke Huevelink-Marck, Eindhoven (NL); Jouke Smink, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/916,819

(22) PCT Filed: Mar. 31, 2021

(86) PCT No.: PCT/EP2021/058390
§ 371 (c)(1),
(2) Date: Oct. 4, 2022

(87) PCT Pub. No.: WO2021/204614
PCT Pub. Date: Oct. 14, 2021

(65) Prior Publication Data
US 2023/0130716 A1    Apr. 27, 2023

(30) Foreign Application Priority Data

Apr. 6, 2020 (EP) .................. 20168137

(51) Int. Cl.
*G01V 3/00* (2006.01)
*G01R 33/567* (2006.01)
(Continued)

(52) U.S. Cl.
CPC ....... *G01R 33/5673* (2013.01); *G01R 33/385* (2013.01); *G01R 33/4818* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 5,017,870 A    5/1991   Kasugai et al.
6,407,548 B1   6/2002   Dietz
(Continued)

FOREIGN PATENT DOCUMENTS

EP    3524994 A1    8/2019
EP    3575812 A1   12/2019
(Continued)

OTHER PUBLICATIONS

Heismann et al "Sequence Based Acoustic Noise Reduction of Clinical MRI Scans" Magnetic Resonance in Med. vol. 73, No. 3, Mar. 1, 2015.
International Search Report and Written Opinion from PCT/EP2021/058390 dated Jun. 23, 2021.

*Primary Examiner* — Walter L Lindsay, Jr.
*Assistant Examiner* — Frederick Wenderoth

(57) ABSTRACT

Disclosed herein is a magnetic resonance imaging system (100) controlled by a processor (130). The execution of the machine executable instructions causes the processor to sort (200) multiple preparatory scan commands (142) into fixed duration preparatory scan commands (144) and indeterminate duration preparatory scan commands (146). The execution of the machine executable instructions further causes the processor to first control (202) the magnetic resonance imaging system with the indeterminate duration preparatory scan commands and then (204) with the fixed duration preparatory scan commands. The execution of the machine executable instructions further causes the processor to calculate (206) a gradient pulse starting time (160). The execution of the machine executable instructions further causes (Continued)

the processor to provide (208) the warning signal at a predetermined time (162) before the gradient pulse starting time. The execution of the machine executable instructions further causes the processor to control (210) the magnetic resonance imaging system with pulse sequence commands to acquire the k-space data such that the execution of the gradient coil pulse commands begins at the pulse starting time.

20 Claims, 5 Drawing Sheets

(51) Int. Cl.
*G01R 33/385* (2006.01)
*G01R 33/48* (2006.01)

(58) Field of Classification Search
USPC .......................................................... 324/309
See application file for complete search history.

(56) References Cited

U.S. PATENT DOCUMENTS

| | | |
|---|---|---|
| 2006/0147070 A1 | 7/2006 | Schreiber |
| 2013/0162510 A1 | 6/2013 | Ohgishi et al. |
| 2013/0245364 A1 | 9/2013 | Gillies et al. |
| 2015/0070012 A1 | 3/2015 | Griswold et al. |
| 2015/0320334 A1 | 11/2015 | Block |
| 2016/0041248 A1* | 2/2016 | Chen .................... G01R 33/283 |
| | | 324/309 |
| 2016/0235335 A1 | 8/2016 | Kim et al. |
| 2018/0078217 A1 | 3/2018 | Nufer et al. |
| 2018/0120396 A1* | 5/2018 | Weiss .................... A61B 18/02 |

FOREIGN PATENT DOCUMENTS

| | | |
|---|---|---|
| WO | 2015044128 A1 | 4/2015 |
| WO | 2015063772 A2 | 5/2015 |

* cited by examiner

MAGNETIC RESONANCE IMAGING SYSTEM WITH ACOUSTIC WARNING SIGNAL

CROSS REFERENCE TO RELATED APPLICATIONS

This application is a U.S. national phase application of International Application No. PCT/EP2021/058390 filed on Mar. 31, 2021, which claims the benefit of EP Application Serial No. 20168137.6 filed Apr. 6, 2020 and is incorporated herein by reference.

FIELD OF THE INVENTION

The invention relates to Magnetic Resonance Imaging, in particular to a system for warning a subject of acoustic noise in advance.

BACKGROUND OF THE INVENTION

A large static magnetic field is used by Magnetic Resonance Imaging (MRI) scanners to align the nuclear spins of atoms as part of the procedure for producing images within the body of a subject. This large static magnetic field is referred to as the B0 field or the main magnetic field. For spatial encoding, a magnetic field gradient coil system is used to superimpose time dependent gradient magnetic fields on the B0 field. The gradient magnetic fields are generated by supplying magnetic gradient coils with electrical current. Changes in the electrical current can result in loud repetitive audible noises during a magnetic resonance imaging examination.

International patent application publication WO 2015/044128 discloses a patient information system and an associated medical imaging system for providing information to a patient who is examined in a scanning device such as an MRI scanner. In one example, the system comprises a display for displaying live images of an external area, for example images taken by an operator camera in an operator area or images taken by a family camera in a waiting area. The display may show an indication of body regions that have already been scanned and/or that still need to be scanned, thus allowing the patient to monitor the progress of the ongoing scanning procedure.

SUMMARY OF THE INVENTION

The invention provides for a magnetic resonance imaging system, a computer program, and a method in the independent claims. Embodiments are given in the dependent claims.

At the start of a magnetic resonance imaging scan, large noises generated by the gradient coil system can startle a subject causing subject movement. This can lead to artifacts and blurring in the resulting magnetic resonance image. To help reduce or eliminate this, embodiments provide for a system that provides a warning signal to the subject to warn of when loud noises will start. However, this is not an easy task. Before the magnetic resonance imaging scan can commence a number of preparatory scan commands are performed. These preparatory scan commands may for example be used to determine the state of the magnetic resonance imaging system as well as align the acquisition. It is often times open ended as to how long the preparatory scan commands will take. Providing a warning signal to the subject therefore introduces a delay in the magnetic resonance imaging scan.

Embodiments may reduce or eliminate this delay by sorting the multiple preparatory scan commands into fixed duration preparatory scan commands and indeterminate duration preparatory scan commands. The magnetic resonance imaging system then executes the indeterminate duration preparatory scan commands first. This enables the warning signal to be provided, even during execution of the fixed duration preparatory scan commands, at a predictable time before noise is generated by the magnetic field gradient coil system.

In one aspect the invention provides for a magnetic resonance imaging system that is configured for acquiring imaging k-space data from an imaging zone. In a magnetic resonance imaging system, the data is acquired in k-space. The imaging k-space data is a reference to particular k-space data that is acquired by the magnetic resonance imaging system. The magnetic resonance imaging system comprises a magnetic field gradient coil system configured for generating magnetic gradient fields within the imaging zone. The imaging zone may be a region of magnetic field generated by a magnet or main magnet where the magnetic field is constant enough and high enough to enable magnetic resonance imaging. The magnetic field gradient coil system is used to provide gradient magnetic fields to enable spatial encoding of the k-space data.

The magnetic resonance imaging system further comprises a signaling system configured for providing a warning signal to a subject located at least partially within the imaging zone. In different examples the signaling system may have different types of components. For example, the warning signal may comprise a visual and/or audio signal in some examples. As the subject is located at least partially within the imaging zone when the k-space data is acquired then the k-space data is descriptive of that portion of the subject within the imaging zone. The magnetic resonance imaging system further comprises a memory containing machine-executable instructions for execution by a processor configured for controlling the magnetic resonance imaging system.

The memory further contains pulse sequence commands configured for controlling the magnetic resonance imaging system to acquire the imaging k-space data according to magnetic resonance imaging protocol. The magnetic resonance imaging protocol may be one of any one of a variety of magnetic resonance imaging protocols used to acquire and then reconstruct magnetic resonance images. The pulse sequence commands comprise gradient coil pulse commands configured for controlling the magnetic field gradient coil system to generate the magnetic gradient fields within the imaging zone. The application of time-dependent currents to generate the magnetic gradient fields is a major source of noise within magnetic resonance imaging systems. The gradient coil pulse commands therefore are related to the audible noise that is produced by a magnetic resonance imaging system during the acquisition of the imaging k-space data.

The memory further contains multiple preparatory scan commands for configuring the magnetic resonance imaging system for acquisition of the imaging k-space data.

The multiple preparatory scan commands for a particular subject or acquisition of the imaging k-space data may vary depending upon the present state of the magnetic resonance imaging system as well as the type of magnetic resonance imaging protocol. Typically, the multiple preparatory scan commands are used for ascertaining the state of the magnetic resonance imaging system and/or for acquiring data which is then used to configure the magnetic resonance imaging system.

The magnetic resonance imaging system further comprises a processor configured for controlling the magnetic resonance imaging system. Execution of the machine-executable instructions further causes the processor to sort the multiple preparatory scan commands into fixed duration preparatory scan commands and indeterminate duration preparatory scan commands. Examples of the fixed duration preparatory scan commands and the indeterminate duration preparatory scan commands are given in the description below and throughout the application.

In general, the fixed duration preparatory scan commands are preparatory scan commands that require a fixed amount of time. It is therefore able to predict accurately how long it will take to execute the fixed duration preparatory scan commands. The indeterminate duration preparatory scan commands may be preparatory scan commands that are of an iterative nature and it is therefore indeterminate or unknown how long they will take to execute. In some cases, the indeterminate duration preparatory scan commands may be indeterminate until other measurements or preparatory scan commands are performed. In some examples the scan commands which are the indeterminate duration preparatory scan commands may be moved or transitioned into being fixed duration preparatory scan commands as the preparation for acquiring the magnetic resonance imaging data proceeds. They may actually therefore be sorted more than once or repeatedly.

Execution of the machine-executable instructions further causes the processor to control the magnetic resonance imaging system with the indeterminate duration preparatory scan commands. During this phase the magnetic resonance imaging system goes through and executes the preparatory scan commands for which it does not know how long it will take to finish them. Execution of the machine-executable instructions further causes the processor to control the magnetic resonance imaging system with the fixed duration preparatory scan commands after controlling the magnetic resonance imaging system with the indeterminate duration preparatory scan commands.

In other words, there is an order for the preparatory scan commands such that the ones of the indeterminate duration are performed before those with a known duration. This may have the benefit that once the indeterminate duration preparatory scan commands have been finished it is then very predictable when the fixed duration preparatory scan commands will be finished. This for example enables, with a great degree of accuracy, to predict when the magnetic resonance imaging system will begin to generate noise by applying currents to the magnetic field gradient coil system. This is therefore able to predict with great accuracy when audible noise will be produced.

Execution of the machine-executable instructions further causes the processor to calculate a gradient pulse starting time which comprises a delay to allow completion of the fixed duration preparatory scan commands and for the beginning of the gradient coil pulse commands. The gradient pulse starting time is then equivalent to a time when the magnetic resonance imaging system will begin to produce audible noise due to the generation of the magnetic gradient fields with the magnetic field gradient coil system. Execution of the machine-executable instructions further causes the processor to provide a signal at a predetermined time before the gradient pulse starting time.

The warning signal may then be used to provide a warning to the subject that noise will begin to be generated by the magnetic resonance imaging system before it occurs. Execution of the machine-executable instructions further causes the processor to control the magnetic resonance imaging system with the pulse sequence commands to acquire the k-space data such that the beginning of the execution of the gradient coil pulse commands occurs at the pulse starting time. This may provide a means to better prepare a subject who is being imaged in the magnetic resonance imaging system. A difficulty is that the large noises generated by the gradient pulses may startle or cause a subject to move which may therefore spoil or cause artefacts or reduce the quality of the magnetic resonance images. Embodiments may have the benefit that the warning signal can be very accurately provided to the subject as a means of warning that the audible noise will be caused by the gradient coil system.

In another embodiment the fixed duration preparatory scan commands comprise a radio-frequency noise calibration. Typically, a magnetic resonance imaging system has a transmitter, receiver or transceiver that is used during the acquisition of the k-space data. During the RF noise calibration, the noise of the system may be measured. This however is typically done such that it takes a predictable amount of time. The radio-frequency noise calibration can then be determined as being part of the fixed duration preparatory scan commands.

In another embodiment the indeterminate duration preparatory scan comprises an F0 center frequency determination scan.

In another embodiment the indeterminate duration preparatory scan commands comprise a survey scan. In particular the area that a survey scan covers may vary and also the survey scan may be performed more than once. It is therefore very difficult to predict how long a survey scan will take.

In another embodiment the fixed duration preparatory scan comprises a B0 scan. In many instances the B0 scan is performed after the survey scan. Before the survey scan is performed it may be unknown how long the B0 scan may take. After the survey scan has been performed then the B0 scan may be moved from the indeterminate duration to the fixed duration preparatory scan commands.

In another embodiment the fixed duration preparatory scan commands comprise a B1 scan. As with the B0 scan, the duration of the B1 scan may be unknown until after the region of interest or geometry of the scan has been specified. This is typically after the survey scan has been performed.

In another embodiment at least a portion of the indeterminate duration preparatory scan commands are dependent upon a motion phase of the subject. For example, the motion phase may be a cardiac phase, a respiratory phase or a combination thereof. Because the scans are dependent upon the motion phase of the subject it is difficult to predict how long they will take to perform.

In another embodiment the motion phase is any one of the following: a cardiac phase, a respiratory phase, and combinations thereof.

In another embodiment the indeterminate duration preparatory scan commands comprise a B0 scan and/or a B1 scan. This is in particular when the B0 scan and the B1 scan is performed for a particular motion phase of the subject.

This is an example of how in some instances a preparatory scan command may be an indeterminate duration whereas in other protocols it may be a fixed duration preparatory scan command.

In another embodiment execution of the indeterminate duration preparatory scan commands provides a first configuration data. Execution of the fixed duration preparatory scan commands provides second configuration data. The first configuration data and the second configuration data may for example be derived from measurements made by the indeterminate duration preparatory scan commands and the fixed duration preparatory scan commands respectively. Execution of the machine-executable instructions further causes the processor to configure the magnetic resonance imaging system by adjusting the pulse sequence commands with at least a portion of the first configuration data and at least a portion of the second configuration data. The measurements are therefore used to configure the acquisition of the imaging k-space data.

In another embodiment the delay comprises an idle time. To ensure that the subject is given ample warning before the auditory noise due to the gradient coil system it may be beneficial to include an idle time. This may also be used as a buffer in case the number of fixed duration preparatory scan commands is too small.

In another embodiment the idle time is adjusted on the fly during execution of the indeterminate duration preparatory scan commands. This may be beneficial because the warning signal can then be performed or provided to the subject in an efficient manner.

In another embodiment the sorting of the multiple preparatory scan commands into the fixed duration preparatory scan commands and the indeterminate duration preparatory scan commands is adjusted during execution of the indeterminate duration preparatory scan commands. As the indeterminate duration preparatory scan commands are performed the duration of some other preparatory scan commands may become known. The example that was given previously is knowing the scan geometry and then using this to determine the duration of the B0 and B1 measurements.

In another embodiment the beginning of the gradient coil pulse commands is determined when the gradient coil pulse commands first specify a gradient current above a predetermined threshold. During the magnetic resonance imaging protocol, the current supplied to the gradient coils is varied as a function of time. The larger the amplitude of a gradient pulse the louder the acoustic noise will be. By using a threshold, it is possible to select an auditory level as to when which provides the warning signal.

In another embodiment the signaling system comprises a visual indicator configured for providing a visual stimulus to the subject. The visual indicator may take different forms in different examples. In one example it may be a screen. In other examples there may be other sorts of displays that are provided. The use of a visual indicator may be beneficial because during the preparatory scan commands there may be some audible noise. The noise generated during the preparatory scan commands will not interfere with a visual indicator.

In another embodiment the visual indicator is configured to provide a light intensity change as the warning signal. This for example may be applied abruptly or gradually.

In another embodiment the visual indicator is configured to provide a visual stimuli of a light color change to the subject. This may also be an abrupt change or a gradual change to warn the subject.

In another embodiment the visual indicator is configured to provide a countdown timer to the subject. The countdown timer may be used to very accurately display the start of the loud acoustic noise. This may enable the subject to prepare her or himself for the louder noise.

In another embodiment the visual indicator is configured to provide an animation as a visual stimulus to the subject. For example, a flower opening or a motion of something may be useful as providing a relaxing warning signal to the subject.

In another embodiment the signaling system comprises an audio signaling system configured for providing an auditory stimulus to the subject. In some instances, the auditory stimulus may be beneficial in also preparing the subject for the loud noise. For example, there may be an automated countdown timer or warning provided to the subject. In other examples there may be background noise which is increased in amplitude to reduce the change in auditory noise when the gradient coil system is engaged.

In another embodiment the audio signaling system is configured to provide the following audio stimuli as at least part of the warning signal to the subject. In one instance this may be an automated vocal warning. In another example this may be an auditory countdown. In another embodiment a series of tones with a decreasing delay as the gradient pulse starting time approaches. This for example may be similar to the system used in many automobiles to warn of an obstruction as the auto driver is reversing. It is very efficient for indicating when something is approaching. Another example of possible audio stimulus would be an auditory signal with an increasing volume as the gradient pulse starting time approaches. For example, the auditory signal could be raised to a level which is equivalent to the gradient coils and then abruptly stopped as the gradient coils begin to produce noise. This would then mean that there is absolutely no abrupt transition in the amount of noise that is heard by the subject. This may for example prevent the subject from becoming startled and moving and spoiling the magnetic resonance imaging procedure or protocol.

In another embodiment execution of the machine-executable instructions causes the processor to reconstruct the magnetic resonance imaging data from the imaging k-space data.

In another aspect the invention provides for a method of operating the magnetic resonance imaging system. The magnetic resonance imaging system is configured for acquiring imaging k-space data from an imaging zone. The magnetic resonance imaging system comprises a magnetic field gradient coil system configured for generating magnetic gradient fields within the imaging zone. The magnetic resonance imaging system further comprises a signaling system configured for providing a warning signal to a subject located at least partially within the imaging zone.

The magnetic resonance imaging system comprises a memory containing pulse sequence commands configured for controlling the magnetic resonance imaging system to acquire the imaging k-space data according to a magnetic resonance imaging protocol. The pulse sequence commands comprise gradient coil pulse commands configured for controlling the magnetic field gradient coil system to generate the magnetic gradient fields within the imaging zone. The memory further contains multiple preparatory scan commands for configuring the magnetic resonance imaging system for acquisition of the imaging k-space data.

The method comprises sorting the multiple preparatory scan commands into fixed duration preparatory scan commands and indeterminate duration preparatory scan commands. The method further comprises controlling the magnetic resonance imaging system with the indeterminate duration preparatory scan commands. The method further comprises controlling the magnetic resonance imaging system with the fixed duration preparatory scan commands after controlling the magnetic resonance imaging system with the indeterminate duration preparatory scan commands. The method further comprises calculating a gradient pulse starting time which comprises a delay to allow completion of the fixed duration preparatory scan commands and for begin of the gradient coil pulse commands. The method further comprises providing the signal at a predetermined time before the gradient pulse starting time. The method further comprises controlling the magnetic resonance imaging system with the pulse sequence commands to acquire the k-space data such that the beginning of the execution of the gradient coil pulse commands occurs at the pulse starting time.

In another aspect the invention provides for a computer program comprising machine-executable instructions for controlling the magnetic resonance imaging system to acquire imaging k-space data from an imaging zone. The magnetic resonance imaging system comprises a magnetic field gradient coil system configured for generating magnetic gradient fields within the imaging zone. The magnetic resonance imaging system comprises a signaling system configured for providing a warning signal to a subject located at least partially within the imaging zone.

The computer program further comprises pulse sequence commands configured for controlling the magnetic resonance imaging system to acquire the imaging k-space data according to a magnetic resonance imaging protocol. The pulse sequence commands comprise gradient coil pulse commands configured for controlling the magnetic field gradient coil system to generate the magnetic gradient fields within the imaging zone. The computer program further comprises multiple preparatory scan commands for configuring the magnetic resonance imaging system for acquisition of the imaging k-space data.

Execution of the machine-executable instructions causes the processor to sort the multiple preparatory scan commands into fixed duration preparatory scan commands and indeterminate duration preparatory scan commands. Execution of the machine-executable instructions further causes the processor to control the magnetic resonance imaging system with the indeterminate duration preparatory scan commands.

Execution of the machine-executable instructions further causes the processor to control the magnetic resonance imaging system with the fixed duration preparatory scan commands after controlling the magnetic resonance imaging system with the indeterminate duration preparatory scan commands. Execution of the machine-executable instructions further causes the processor to calculate a gradient pulse starting time which comprises a delay to allow completion of the fixed duration preparatory scan commands and for begin of the gradient coil pulse commands. Execution of the machine-executable instructions further causes the processor to provide a signal using the signaling system at the predetermined time before the gradient pulse starting time. Execution of the machine-executable instructions further causes the processor to control the magnetic resonance imaging system with the pulse sequence commands to acquire the k-space data such that the beginning of the execution of the gradient coil pulse commands occurs at the pulse starting time.

It is understood that one or more of the aforementioned embodiments of the invention may be combined as long as the combined embodiments are not mutually exclusive.

As will be appreciated by one skilled in the art, aspects of the present invention may be embodied as a apparatus, method, computer program or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon. A computer program comprises the computer executable code or "program instructions".

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing. A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments, computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Generally, the program instructions can be executed on one processor or on several processors. In the case of multiple processors, they can be distributed over several different entities like clients, servers etc. Each processor could execute a portion of the instructions intended for that entity. Thus, when referring to a system or process involving multiple entities, the computer program or program instructions are understood to be adapted to be executed by a processor associated or related to the respective entity.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image or MR image is defined herein as being the reconstructed two- or three-dimensional visualization of anatomic data contained within the k-space data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
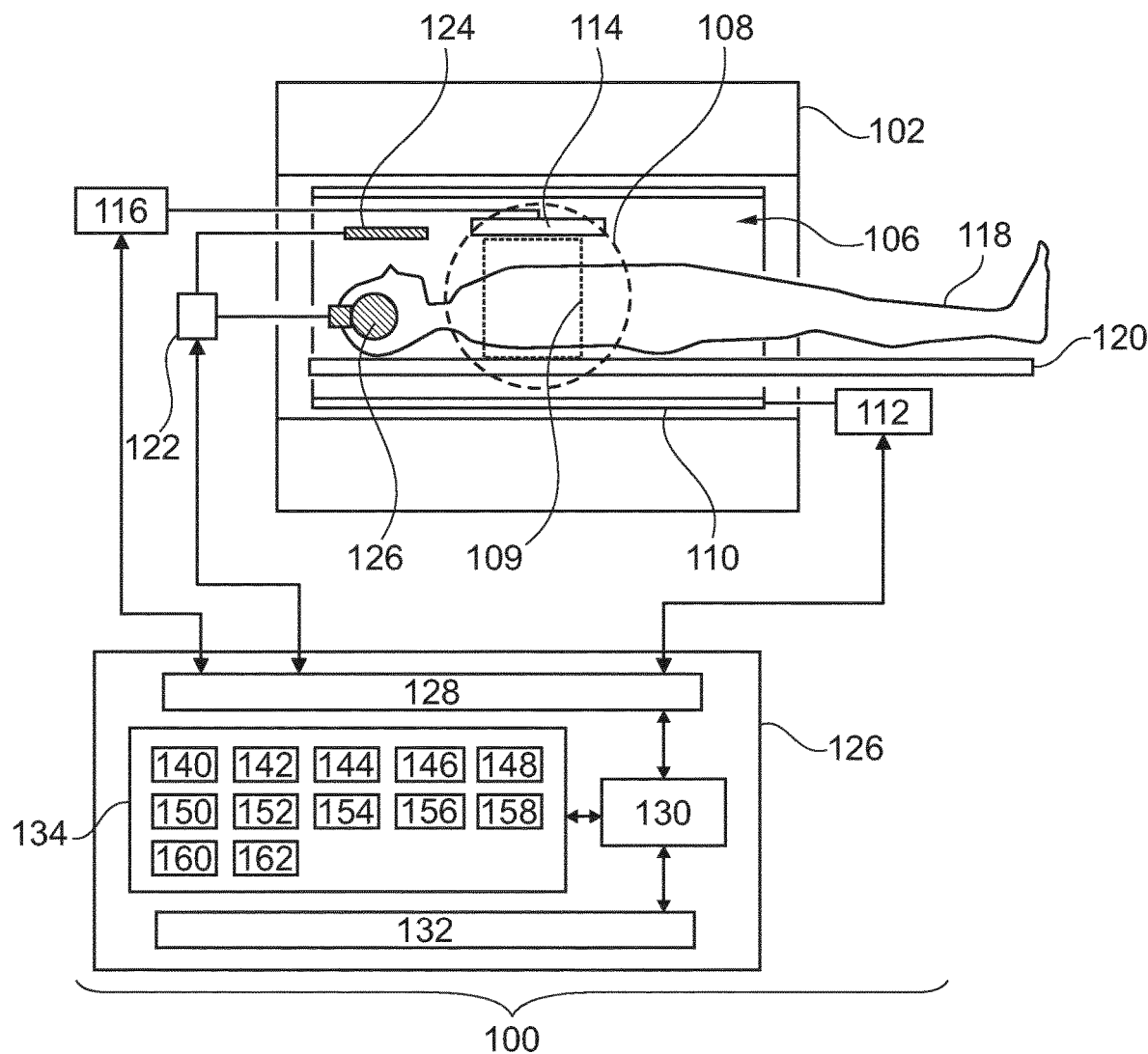
FIG. 1 illustrates an example of a magnetic resonance imaging system.

FIG. 1 illustrates an example of a magnetic resonance imaging system 100. The magnetic resonance imaging system comprises a magnet 102. The magnet 102 may for example be a superconducting magnet. Alternatively, the magnet 102 may be a resistive type magnet.

The use of different types of magnets is also possible; for instance it is possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 102 there is an imaging zone 108 where the magnetic field is strong and uniform enough to perform magnetic resonance imaging. A region of interest 109 is shown within the imaging zone 108. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 102. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for receiving radio transmissions from spins also within the imaging zone 108. In some examples, the radio-frequency coil may also be configured for manipulating the orientations of magnetic spins within the imaging zone 108. The radio frequency antenna may contain multiple coil elements. The radio frequency antenna may also be referred to as a channel or antenna. The radio-frequency coil 114 is connected to a radio frequency receiver or transceiver 116. The radio-frequency coil 114 and radio frequency transceiver 116 may be optionally replaced by separate transmit and receive coils and a separate transmitter and receiver. It is understood that the radio-frequency coil 114 and the radio frequency transceiver 116 are representative. The radio-frequency coil 114 could also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The magnetic resonance imaging system 100 is shown as comprising a signaling system 122. The signaling system 122 may be used to provide the warning signal. The signaling system 122 is shown as comprising a screen or display 124 and a set of headphones 125. The screen 124 may be used for example to provide a change in lighting or providing an image or message to the subject 118. The headphones 125 can be used to provide an auditory warning such as a countdown or even an increasing level of noise to warn the subject 118. In not all embodiments is a screen or necessarily even headphones 125 necessary. The screen 124 and the headphones 125 may be constructed using magnetic resonance imaging compatible technology. For example, there are existing screens 124 and lighting systems which can be used within the bore 106 of the magnet 102 as well as systems for providing headphones 125. For example, forced air may be used to provide the noise to the headphones 125.

The transceiver 116, the gradient controller 112, and the signaling system 122 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples, the memory 130 may be a non-transitory computer-readable medium.

The memory 134 is shown as containing machine-executable instructions. The machine-executable instructions 140 provide a means for the processor 130 to control the magnetic resonance imaging system 100. The machine-executable instructions 140 may also enable the processor 130 to perform various data analysis and image reconstruction tasks. The memory 134 is further shown as containing multiple preparatory scan commands 142. The memory 134 is then shown as containing the fixed duration preparatory scan commands 144 and the indeterminate duration preparatory scan commands 146. The scan commands 144 and 146 were sorted from the multiple preparatory scan commands 142.

The memory 134 is shown as optionally containing first configuration data 148 and second configuration data 150.

The first configuration data 148 is data that was acquired or derived during performing of the fixed duration preparatory scan commands 144. The second configuration data is data that was derived or acquired during execution of the indeterminate duration preparatory scan commands 146. In some examples this may be used for configuring the pulse sequence commands 152. The pulse sequence commands 152 are shown as being stored in the memory 134 also. The pulse sequence commands are commands or data which may be converted into such commands which may be used to control the magnetic resonance imaging system to acquire k-space data. The memory 134 is shown as containing imaging k-space data 156 that was acquired by controlling the magnetic resonance imaging system with the pulse sequence commands 152. The memory 158 is further shown as containing magnetic resonance imaging data 158 that was reconstructed from the imaging k-space data 156. The imaging k-space data 156 may for example be acquired for the region of interest 109.

The pulse sequence commands 152 may contain gradient coil pulse commands 154. The gradient coil pulse commands 154 are commands or data which may be converted into such commands which control the controlled magnetic field gradient coil power supply 112 to provide the magnetic field gradient coils 110 with current. When this happens, it may produce a large auditory noise in the bore 106 of the magnet 102. The memory 134 is further shown as containing a gradient pulse starting time 160 and a predetermined time 162. The gradient pulse starting time 160 is a time when the execution of the gradient coil pulse commands 154 is started. This is essentially a start of when large noises may be produced in the bore 106 of the magnet 102. Knowing when the gradient pulse starting time 160 is the warning signal can be provided at the predetermined time 162.

Figure 2:
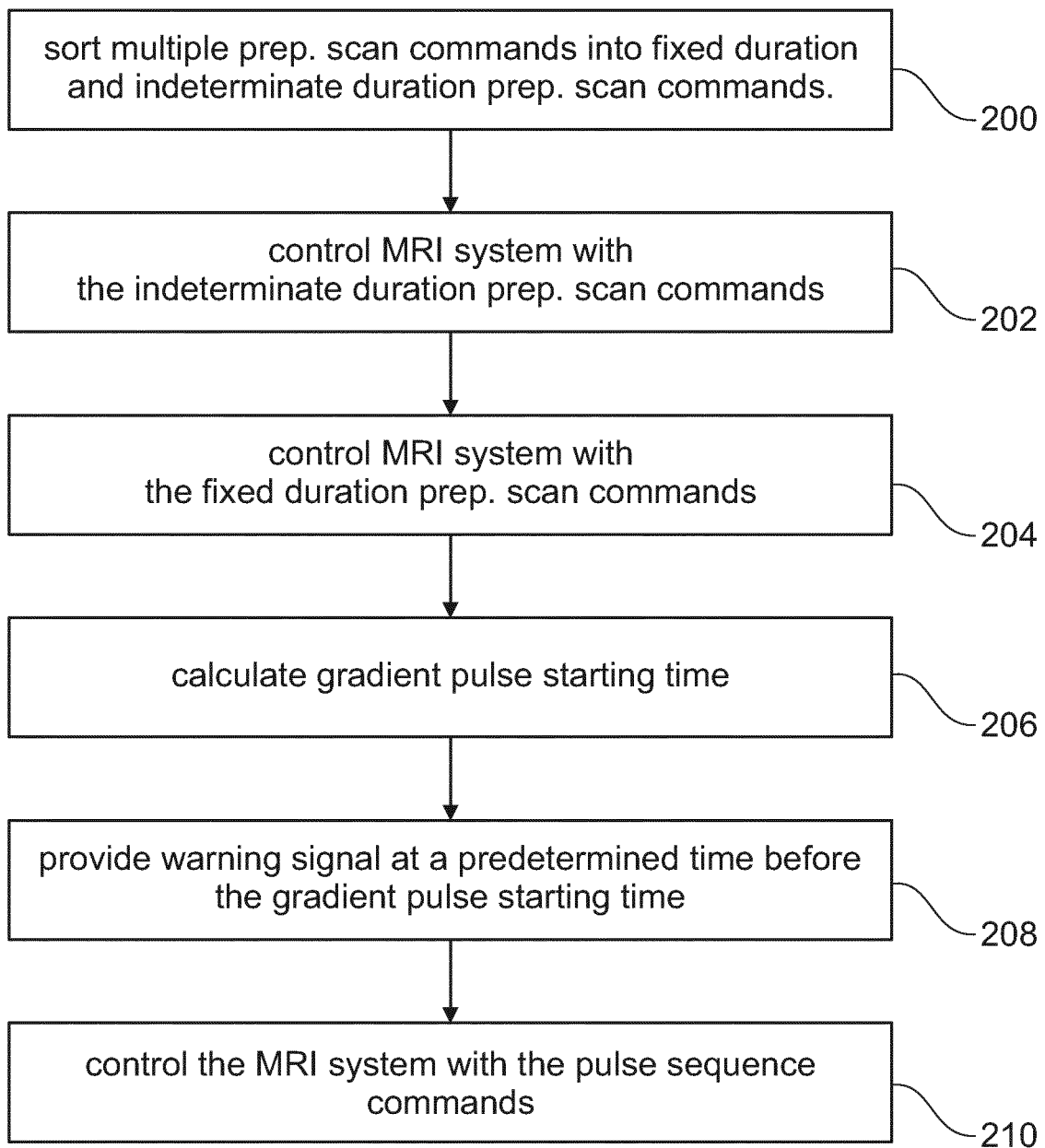
FIG. 2 shows a flow chart which illustrates a method of operating the magnetic resonance imaging system of FIG. 1.

FIG. 2 shows a flowchart which illustrates a method of operating the magnetic resonance imaging system 100 of FIG. 1. First, in step 200, the multiple preparatory scan commands 142 are sorted into the fixed duration preparatory scan commands 144 and the indeterminate duration preparatory scan commands 146. It should be noted that this task may be repeated repeatedly during execution of the method. For example, after some indeterminate duration preparatory scan commands 146 are completed some preparatory scan commands may then have a fixed duration whereas before they did not. Next, in step 202, the magnetic resonance imaging system is controlled with the indeterminate duration preparatory scan commands 146.

Next, in step 204, the magnetic resonance imaging system is controlled with the fixed duration preparatory scan commands 144. In step 206, the gradient pulse starting time 160 is calculated. This comprises a delay which allows completion of the fixed duration preparatory scans and for the gradient coil pulse commands 154 to begin. Next in step 208 the warning signal is provided at a predetermined time 162 before the gradient pulse starting time 160. Finally, in step 210, the magnetic resonance imaging system is controlled with the pulse sequence commands 152 to acquire the imaging k-space data 156.

Figure 3:
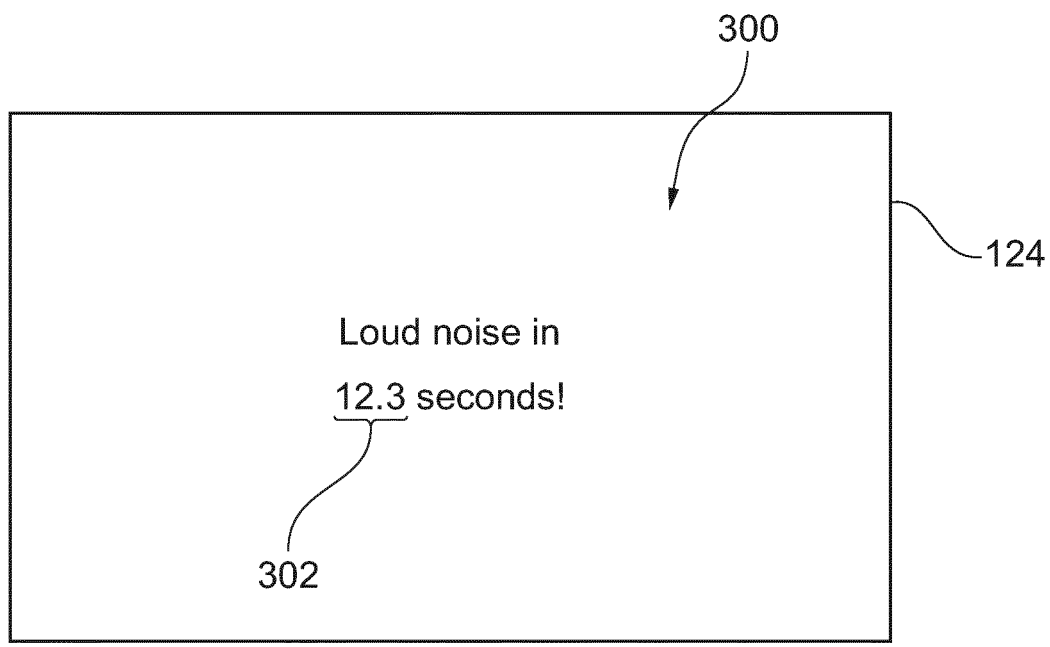
FIG. 3 illustrates an example of a warning signal.

FIG. 3 illustrates an example of a warning signal 300 presented on the display 124. In this example the warning signal 300 comprises a countdown timer 302. In this way the subject 118 will know very accurately when the noise from the gradient pulses starts.

Figure 4:
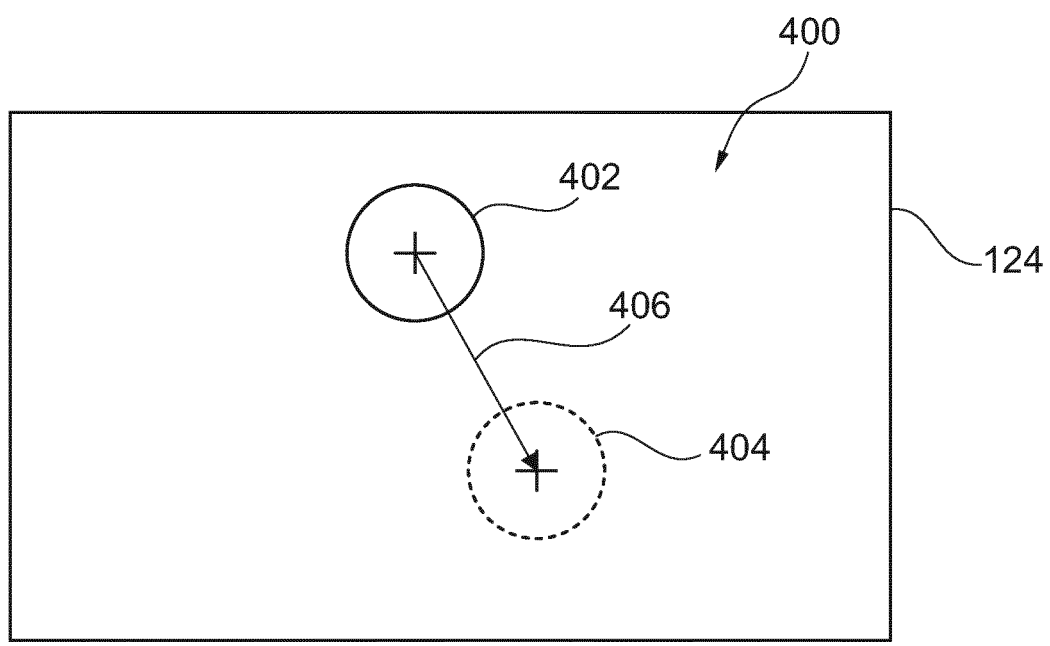
FIG. 4 illustrates a further example of a warning signal.

In some instances, the subject 118 may have a difficult time understanding a countdown timer 302. FIG. 4 displays an alternative. FIG. 4 shows a warning signal 400 that comprises a moving ball 402. The moving ball 402 follows a path 406 to an end position 404. The moving ball 402 is an example of an animation that could be used to provide the warning signal 400. Other things such as a falling ball or opening flower or other motion could also be used as a warning signal 400.

Examples may provide a means, warning system 122, to inform the subject shortly before the start of the sequence about the exact time until the noise starts, for example by visualizing a count-down timer.

Examples may also provide a method to realize a fixed count-down duration, predetermined time before the gradient pulse starting time, even though the length and number of preparation scans preceding the sequence start is generally not known in advance, while at the same time minimizing unnecessary system idle time.

Many subjects feel uncomfortable during MR examinations because of the loud and unexpected noise. Not understanding the origin of the noises may even cause fear. Even though there may be communication with the tech or explanations via autovoice before the start of each scan, the subject will never know when exactly to expect the noise.

During a magnetic resonance examination, the subject typically does not know exactly when a sequence starts and when exactly to expect the accompanying noise (caused by the magnetic gradient coil system). This unexpectedness may cause fear and lead to the feeling that one has no control over what is happening. Unexpected loud noises may even lead to an unwanted slight body motion, thereby affecting image quality.

A magnetic resonance scan is typically preceded by several preparation scans that are almost inaudible but may be accompanied by click sounds. The length and number of the preparation scans required is not always known in advance, because some of these scans are dependent on each other.

It is therefore generally not easy to predict the exact point in time when the scanning noise starts.

Examples may solve this problem by informing the subject shortly before the start of the sequence about the exact time until the noise starts, for example by visualizing a count-down timer (302).

The invention further comprises a method to minimize the idle time (502) of the system during the count-down by filling this period with preparation scans or other activities that do not produce significant noise in an optimal way.

Examples may possibly comprise one or more of the following features:

A method to arrange preparation scans and idle time blocks directly before the scan start, so that a pre-defined count-down period is achieved with minimal system idle time.

A system (signaling system 122) for transmitting a warning signal triggering the count-down.

A system for presenting the count-down to the subject, either optically (124) via a visualization, or acoustically (125).

When an MR scan has been started by the operator, the preparation phase begins at time $t_{prep}$. During the preparation phase, a number of preparation scans may be performed to calibrate the system. After the preparation phase, the actual acquisition of image data starts at $t_{scan}$n.

The preparation phase may be preceded by other events, such as an autovoice announcement.

In the preparation phase, some preparation scans may vary in length and number depending on system state and the outcome previous preparation scans. We therefore distinguish "unpredictable" and "predictable" preparation scans (indeterminate duration preparatory scan commands 146 and fixed duration preparatory scan commands 144). Unpredictable scans are those scans that depend on the previous state of the system and may be adjusted in length and number while the preparation phase is ongoing. Predictable scans are those scans that have a pre-defined length and number that does not change during the preparation phase.

Figure 5:
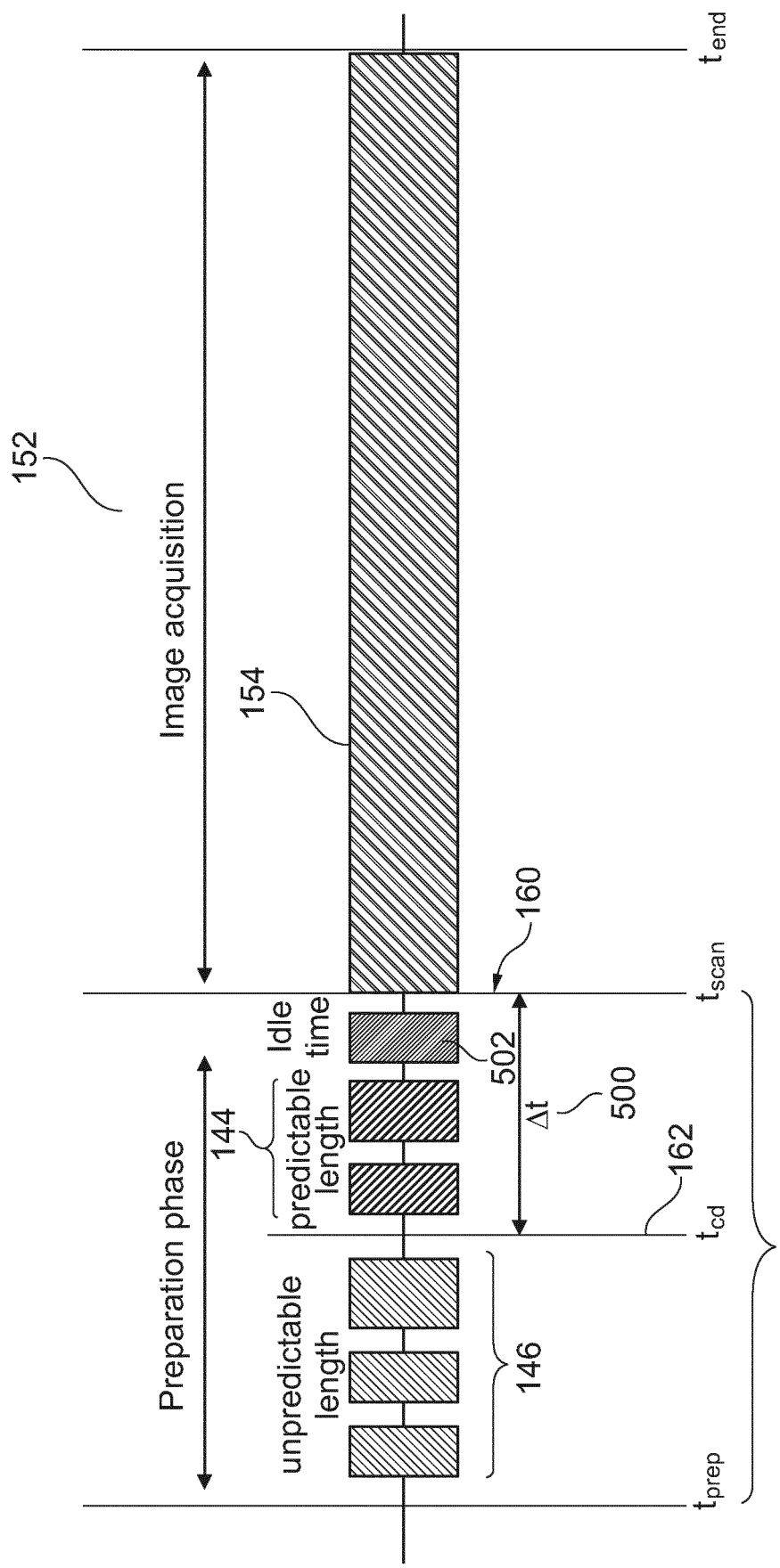
FIG. 5 shows a timing diagram which illustrates the timing of the warning signal.
Figure 6:
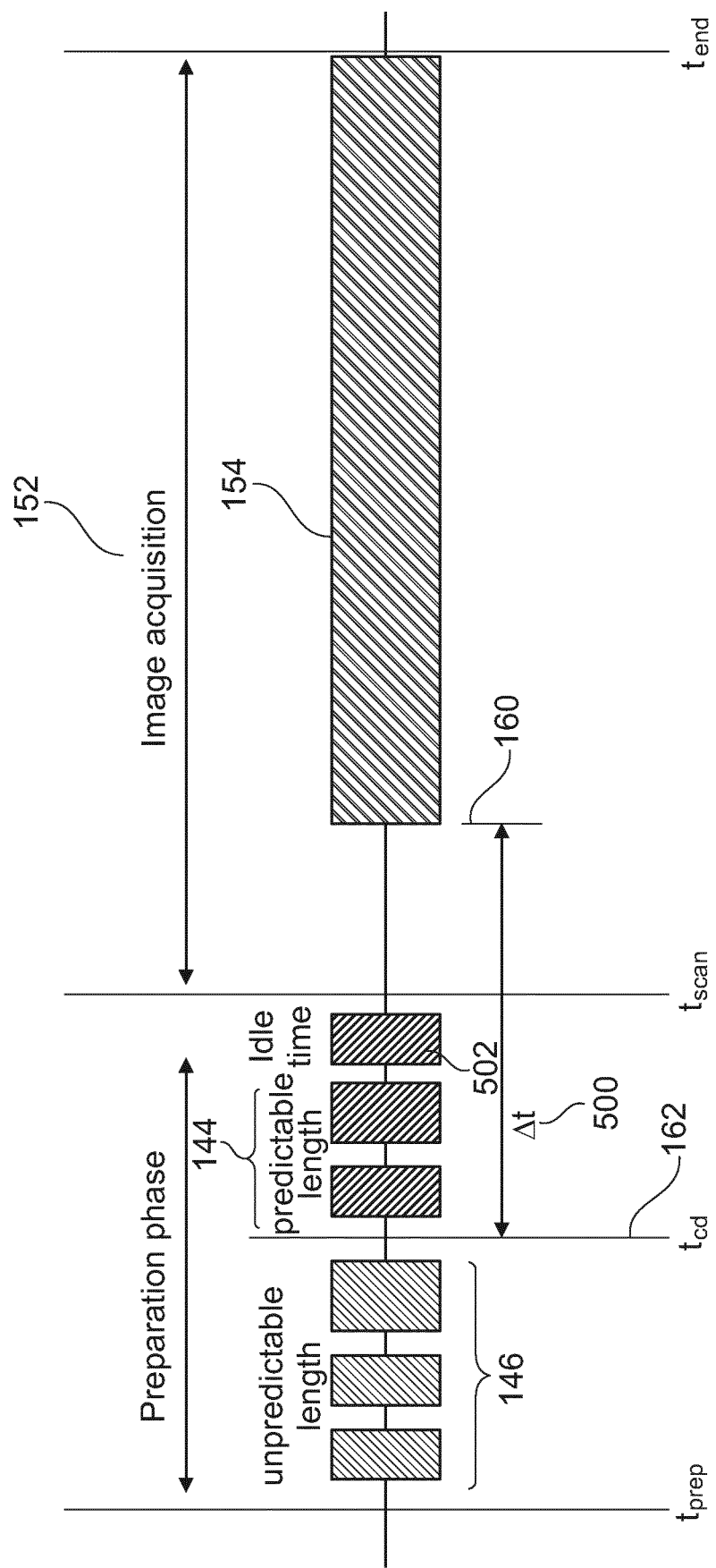
FIG. 6 shows a further timing diagram which illustrates the timing of the warning signal.

FIGS. 5 and 6 below provide schematic overview of the preparation phase and image acquisition timing. Image acquisition can refer to the acquisition of a survey or diagnostic image or to the acquisition of reference image data, such as a SENSE reference scan, a coil survey scan, or B0 or B1 mapping scans.

FIG. 5 shows a timing diagram which illustrates the relation of the indeterminate duration preparatory scan commands 146, the fixed duration preparatory scan commands 144 and the pulse sequence commands 152. It can be seen that the indeterminate duration preparatory scan commands 146 are performed before the fixed duration preparatory scan commands 144. The time labeled 152 illustrates a time when the pulse sequence commands 152 are executed. The large bar 154 represents a time when the gradient coil pulse commands 154 are performed. This is the time when there is large acoustic noise in the bore 106 of the magnet 102. The marking 160 or t-scan represents the time when the gradient pulse starting time 160 is. The time 162 represents the predetermined time 162 when the warning signal 300 or 400 is provided. There may be an optional idle time 502 present. The Δt is the delay 500 between the predetermined time 162 and the gradient pulse starting time 160. An idle time block 502 may be inserted to ensure that Δt has a pre-defined size.

FIG. 6 shows a variation of the timing diagram illustrated in FIG. 5. In this example the gradient pulse starting time 160 starts after the pulse sequence commands 152 have started. In some instances, the gradient pulse starting time 160 is determined by thresholding the value of the current supplied to the gradient coils. This may be a useful measure of how loud the gradient coils will be. In this case the gradient pulse starting time 160 is taken after when the pulse sequence commands 152 have started and this is used to calculate the delay 500 which then gives the predetermined time 162.

A count-down time period of fixed length Δt (predetermined time) may precede the acquisition start (start of the gradient coil pulse commands). In some examples, this is accomplished in the following way:

Group preparation scans (multiple preparatory scan commands) in such a way that predictable scans (fixed duration preparatory scan commands) are preferably performed at the end of the preparation phase.

At the time when all unpredictable preparation scans (indeterminate duration preparatory scan commands) are finished, calculate the sum S of execution times of all predictable preparation scans yet to be performed.

Compare S and Δt.

If S<Δt, send the count-down start signal immediately and add a system idle time $t_{idle}=\Delta t-S$ at the end of the preparation phase Otherwise, proceed with the preparation scans and send the count-down start signal at time $t_{cd}=t_{scan}-\Delta t$.

Proceed with image acquisition after the preparation phase

A connection to the in-bore an experience system (display 124) can be realized in some examples, by a network connection. For example, the already existing REST-API can be extended to serve this purpose.

The scanner host will send signals to the in-bore experience system at time points $t_{prep}$ and tcd. Since the count-down time is known, sending a signal at $t_{scan}$ n is not necessary. If scanning is aborted before data acquisition starts at $t_{scan}$ n, a stop signal is sent through the API. The in-bore system will start or stop the visualizations or audio feedback described below when receiving the signals.

In some examples, the subject may be shown for example two types of visualization during the preparation period:

Between $t_{prep}$ and $t_{cd}$: A visualization of variable length (looping visualization) is shown. This visualization should be understood by the subject as showing that the system is preparing for the scan. Examples include moving cogwheels or an animated hourglass Between $t_{cd}$ and $t_{scan}$: A visualization of fixed length is displayed, where the remaining time until the scan start is clearly visible. Examples include a count-down timer or a graphical progress indicator.

This visualization may be combined with a continuation of the previous visualization.

As an alternative, the warning signal my be implemented as an acoustic count-down. Subjects that are visually handicapped or cannot see the in-bore screen due to their positioning on the subject table may appreciate an acoustic count-down alternative. The acoustic countdown may be realized by a computer voice counting ("Three", "Two", "One"), or by other audible elements, such as beeps or clicks. Between $t_{prep}$ and $t_{cd}$, Looping audio elements of variable total length could be employed. For example, a voice explaining "The system is preparing", accompanied by a short repetitive melody.

The examples described above may be the suitable implementation for a "normal" scan start, where noise appears directly at the start of the sequence and the count-down is smartly integrated into the preparation phase.

In a different example, a "silent start" relates to MR sequences that generate noise not at the beginning of the sequence, but some pre-defined time later. An example for such a sequence is FLAIR, where the sequence starts with an (almost inaudible) spin excitation event, followed by a long inversion time (several seconds). Only after the inversion time the loud noises start.

For such a sequence, the noise count-down can be shown before the start of the noise (start of the gradient coil pulse commands) instead of before the start of the sequence. In the inversion time is shorter than the count-down duration, the first part of the count-down period can again be filled with remaining prep scans of known length.

One embodiment ("breathing") relates to MR sequences that require breathing instructions:

1. Breath-holds: The count-down can be used to visualize when the breathe-out period ends and, accordingly, when the breath-hold period starts during which image acquisition will happen and therefore noise will be heard 2. Free breathing: After an analysis of the breathing pattern, and given the specified parameters of the respiratory triggered scan, the start of the first acquisition sound can be predicted and a count-down can be visualized accordingly in advance. This application requires that the subject's breathing pattern is very regular, so that the prediction can be done to some pre-defined degree of accuracy and there is no confusion about a count-down that does not really match. In the case of a non-regular breathing pattern, this functionality may not necessarily be enabled.

In another example, a quick count-down or progress bar is shown for the predicted start of cardiac triggered scans. This application should only be used for subjects with a very regular heartbeat, so that the prediction can be done to some pre-defined degree of accuracy. In the case of arrhythmia, a wrong count-down could lead to anxiety.

In another example, when there is no or only a very short preparation phase before the scan start, the visualization of the count-down can start while the autovoice announcement is still ongoing (i.e., after the tech has pressed the start button but before the prep phase of the scan starts). In this case, the length of the autovoice language-specific audio file must be known and taken into account in the determination of $t_{cd}$.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
102 magnet
106 bore of magnet
108 imaging zone
109 region of interest
110 magnetic field gradient coils
112 magnetic field gradient coil power supply
114 radio-frequency coil
116 transceiver
118 subject
120 subject support
122 signaling system
124 screen
125 headphones
126 computer system
128 hardware interface
130 processor
132 user interface
134 computer memory
140 machine executable instructions
142 multiple prepratory scan commands
144 fixed duration prepratory scan commands
146 indeterminate duration prepratory scan commands
148 first configuration data
150 second configuration data
152 pulse sequence commands
154 gradient coil pulse commands
156 imaging k-space data
158 magnetic resonance imaging data
160 gradient pulse starting time
162 predetermined time
200 sort the multiple preparatory scan commands into fixed duration preparatory scan commands and indeterminate duration preparatory scan commands
202 control the magnetic resonance imaging system with the indeterminate duration preparatory scan commands
204 control the magnetic resonance imaging system with the fixed duration preparatory scan commands after controlling magnetic resonance imaging system with the indeterminate duration preparatory scan commands
206 calculate a gradient pulse starting time which comprises a delay to allow completion of the fixed duration preparatory scan commands and for a begin of the gradient coil pulse commands
208 provide the warning signal at a predetermined time before the gradient pulse starting time
210 control the magnetic resonance imaging system with the pulse sequence commands to acquire the k-space data such that the beginning of the execution of the gradient coil pulse commands occurs at the pulse starting time
300 warning signal
302 countdown timer
400 warning signal
402 moving ball
404 end position
406 path
500 delay
502 idle time

The invention claimed is:

1. A magnetic resonance imaging system configured to acquire imaging k-space data from an imaging zone, wherein the magnetic resonance imaging system comprises:
a magnetic field gradient coil system configured to generate magnetic gradient fields within the imaging zone;
a signaling system configured to provide a warning signal to an associated subject located at least partially within the imaging zone;
a memory containing machine executable instructions wherein the memory further contains pulse sequence commands configured to control the magnetic resonance imaging system to acquire the imaging k-space data according to a magnetic resonance imaging protocol, wherein the pulse sequence commands comprise gradient coil pulse commands configured to control the magnetic field gradient coil system to generate the magnetic gradient fields within the imaging zone, wherein the memory further contains multiple preparatory scan commands to configure the magnetic resonance imaging system to acquire the imaging k-space data;
a processor configured to control the magnetic resonance imaging system, wherein execution of the machine executable instructions causes the processor to:
sort the multiple preparatory scan commands into fixed duration preparatory scan commands and indeterminate duration preparatory scan commands;
control the magnetic resonance imaging system with the indeterminate duration preparatory scan commands;
control the magnetic resonance imaging system with the fixed duration preparatory scan commands after controlling magnetic resonance imaging system with the indeterminate duration preparatory scan commands;
calculate a gradient pulse starting time which comprises a delay to allow completion of the fixed duration preparatory scan commands and for a begin of the gradient coil pulse commands;

provide the warning signal to the associated subject at a predetermined time before the gradient pulse starting time; and control the magnetic resonance imaging system with the pulse sequence commands to acquire the k-space data such that the beginning of the execution of the gradient coil pulse commands occurs at the pulse starting time.

2. A method of operating a magnetic resonance imaging system, wherein the magnetic resonance imaging system is configured to acquire imaging k-space data from an imaging zone wherein the magnetic resonance imaging system comprises a magnetic field gradient coil system configured to generate magnetic gradient fields within the imaging zone, wherein the magnetic resonance imaging system further comprises a signaling system configured to provide a warning signal to an associated subject located at least partially within the imaging zone, wherein the magnetic resonance imaging system comprises a memory containing pulse sequence commands configured to control the magnetic resonance imaging system to acquire the imaging k-space data according to a magnetic resonance imaging protocol, wherein the pulse sequence commands comprise gradient coil pulse commands configured to control the magnetic field gradient coil system to generate the magnetic gradient fields within the imaging zone, wherein the memory further contains multiple preparatory scan commands to configure the magnetic resonance imaging system for acquisition of the imaging k-space data;

wherein the method comprises:

sorting the multiple preparatory scan commands into fixed duration preparatory scan commands and indeterminate duration preparatory scan commands;

controlling the magnetic resonance imaging system with the indeterminate duration preparatory scan commands;

controlling the magnetic resonance imaging system with the fixed duration preparatory scan commands after controlling magnetic resonance imaging system with the indeterminate duration preparatory scan commands;

calculating a gradient pulse starting time which comprises a delay to allow completion of the fixed duration preparatory scan commands and for a begin of the gradient coil pulse commands;

providing the warning signal to the associated subject at a predetermined time before the gradient pulse starting time; and controlling the magnetic resonance imaging system with the pulse sequence commands to acquire the k-space data such that the beginning of the execution of the gradient coil pulse commands occurs at the pulse starting time.

3. A computer program comprising machine executable instructions stored on a non-transitory computer readable medium, wherein the machine executable instructions are configured to control a magnetic resonance imaging system to acquire imaging k-space data from an imaging zone, wherein the magnetic resonance imaging system comprises a magnetic field gradient coil system configured to generate magnetic gradient fields within the imaging zone, wherein the magnetic resonance imaging system comprises a signaling system configured to provide a warning signal to an associated subject located at least partially within the imaging zone, wherein the computer program further comprises pulse sequence commands configured to control the magnetic resonance imaging system to acquire the imaging k-space data according to a magnetic resonance imaging protocol, wherein the pulse sequence commands comprise gradient coil pulse commands configured to control the magnetic field gradient coil system to generate the magnetic gradient fields within the imaging zone, wherein the computer program further comprises multiple preparatory scan commands to configure the magnetic resonance imaging system for acquisition of the imaging k-space data;

wherein execution of the machine executable instructions causes the magnetic resonance imaging system to:

sort the multiple preparatory scan commands into fixed duration preparatory scan commands and indeterminate duration preparatory scan commands;

control the magnetic resonance imaging system with the indeterminate duration preparatory scan commands;

control the magnetic resonance imaging system with the fixed duration preparatory scan commands after controlling magnetic resonance imaging system with the indeterminate duration preparatory scan commands;

calculate a gradient pulse starting time which comprises a delay to allow completion of the fixed duration preparatory scan commands and for a begin of the gradient coil pulse commands;

provide the warning signal to the associated subject at a predetermined time before the gradient pulse starting time; and control the magnetic resonance imaging system with the pulse sequence commands to acquire the k-space data such that the beginning of the execution of the gradient coil pulse commands occurs at the pulse starting time.

4. The magnetic resonance imaging system of claim 1, wherein the fixed duration preparatory scan commands comprise a radio-frequency noise calibration.

5. The magnetic resonance imaging system of claim 1, wherein the indeterminate duration preparatory scan commands comprise at least one of a f0 center frequency determination scan or a survey scan.

6. The magnetic resonance imaging system of claim 1, wherein the fixed duration preparatory scan commands comprise at least one of a B0 scan or a B1 scan.

7. The magnetic resonance imaging system of claim 1, wherein at least a portion of indeterminate duration preparatory scan commands are dependent upon a motion phase of the associated subject.

8. The magnetic resonance imaging system of claim 7, wherein the indeterminate duration preparatory scan commands comprise at least one of the following: a B0 scan or a B1 scan.

9. The magnetic resonance imaging system of claim 1, wherein the delay comprises an idle time.

10. The magnetic resonance imaging system of claim 1, wherein the beginning of the gradient coil pulse commands is determined as when the gradient coil pulse commands first specify a gradient current above a predetermined threshold.

11. The magnetic resonance imaging system of claim 1, wherein the signaling system comprises a visual indicator configured for providing a visual stimulus to the associated subject.

12. The magnetic resonance imaging system of claim 11, wherein the visual indicator is configured to provide at least one of the following visual stimuli to the associated subject: a light intensity change, a light color change, a countdown timer, or an animation.

13. The magnetic resonance imaging system of claim 1, wherein the signaling system comprises an audio signaling system configured for providing an auditory stimulus to the associated subject.

14. The magnetic resonance imaging system of claim 13, wherein the audio signaling system is configured to provide at least one of the following audio stimuli to the associated subject: an automated vocal warning, an auditory countdown, a series of tones with a decreasing delay as the gradient pulse starting time approaches, or an auditory signal with an increasing volume as the gradient pulse starting time approaches.

15. The magnetic resonance imaging system of claim 1, wherein execution of the machine executable instructions causes the processor to reconstruct magnetic resonance imaging data from the imaging k-space data.

16. The magnetic resonance imaging system of claim 1, wherein the warning signal is a visual indicator configured for providing a visual stimulus to the associated subject.

17. The magnetic resonance imaging system of claim 1, wherein the visual indicator is configured to provide at least one of the following visual stimuli to the associated subject: a light intensity change, a light color change, a countdown timer, or an animation.

18. The magnetic resonance imaging system of claim 1, wherein the warning signal comprises an audio signaling system configured for providing an auditory stimulus to the associated subject.

19. The magnetic resonance imaging system of claim 13, wherein the audio signaling system is configured to provide at least one of the following audio stimuli to the associated subject: an automated vocal warning, an auditory countdown, a series of tones with a decreasing delay as the gradient pulse starting time approaches, or an auditory signal with an increasing volume as the gradient pulse starting time approaches.

20. The method of claim 2 further including outputting the warning signal to the associated subject through at least one of an audio signal or a visual signal.

* * * * *